United States Patent
Sankman

(10) Patent No.: US 12,034,412 B2
(45) Date of Patent: Jul. 9, 2024

(54) DIFFERENTIAL AMPLIFIER COMPENSATION

(71) Applicant: TEXAS INSTRUMENTS INCORPORATED, Dallas, TX (US)

(72) Inventor: Joseph Sankman, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 294 days.

(21) Appl. No.: 17/710,029

(22) Filed: Mar. 31, 2022

(65) Prior Publication Data

US 2023/0046993 A1 Feb. 16, 2023

Related U.S. Application Data

(60) Provisional application No. 63/232,636, filed on Aug. 13, 2021.

(51) Int. Cl.
| | |
|---|---|
| H03M 1/12 | (2006.01) |
| H03F 1/42 | (2006.01) |
| H03F 3/04 | (2006.01) |
| H03F 3/30 | (2006.01) |
| H03F 3/45 | (2006.01) |

(52) U.S. Cl.
CPC .............. *H03F 1/42* (2013.01); *H03F 3/04* (2013.01); *H03M 1/12* (2013.01); *H03F 3/30* (2013.01); *H03F 3/45* (2013.01); *H03F 2200/36* (2013.01)

(58) Field of Classification Search
CPC ..... H03F 1/42; H03F 3/04; H03F 3/45; H03F 3/30; H03M 1/12
See application file for complete search history.

(56) References Cited

U.S. PATENT DOCUMENTS

| | | | |
|---|---|---|---|
| 5,541,555 A | * | 7/1996 | Pernici ................ H03F 3/45183 330/253 |
| 7,196,573 B1 | | 3/2007 | Bailey et al. |
| 9,401,679 B1 | | 7/2016 | Vijaykumar |
| 2013/0249294 A1 | | 9/2013 | Saito et al. |
| 2019/0363686 A1 | | 11/2019 | Grasso |

OTHER PUBLICATIONS

International Search Report dated Nov. 24, 2022.
Hubbard Dylan et al: "ADC Voltage Reference Buffer Optimization Reference Design for High-Performance DAQ Systems ADC Voltage Reference Buffer Optimization Reference Design for High-Performance DAQ Systems," Jan. 31, 2018 (Jan. 31, 2018), XP055944309, Retrieved from the Internet: URL:https://www.ti.com/lit/ug/tidude2a/tidude2a.pdf?ts=1658242927042&ref_url=https%3A%2F%2Fwww.google.com%2F.

* cited by examiner

*Primary Examiner* — Joseph J Lauture
(74) *Attorney, Agent, or Firm* — Charles F. Koch; Frank D. Cimino

(57) ABSTRACT

An amplifier includes a first stage and a second stage. The first stage includes a first output and a second output. The second stage includes an output, a first transistor and a second transistor. The first transistor includes a drain coupled to the first output of the first stage, and a source coupled to the output of the second stage. The second transistor includes a drain coupled to the second output of the first stage, and a gate coupled to the output of the second stage.

20 Claims, 4 Drawing Sheets

DIFFERENTIAL AMPLIFIER COMPENSATION

CROSS-REFERENCE TO RELATED APPLICATIONS

This application claims priority to U.S. Provisional Application No. 63/232,636 filed Aug. 13, 2021, entitled "Differential Ahuja Compensation," which is hereby incorporated by reference.

BACKGROUND

Amplifiers are used in a wide variety of applications. In amplifier circuits, various compensation techniques are applied for adjusting the amplifier's frequency response. Many amplifiers are implemented using multiple stages (e.g., two stages). Miller compensation and Ahuja compensation are compensation techniques that are sometimes applied in two-stage amplifiers. Miller compensation employs a feedback capacitor connected across an input and output of the second amplifier stage. Ahuja compensation is a cascode compensation scheme used in some amplifier circuits to improve the bandwidth over Miller compensation.

SUMMARY

In one example, an amplifier includes a first stage and a second stage. The first stage includes a first output and a second output. The second stage includes an output, a first transistor and a second transistor. The first transistor includes a drain coupled to the first output of the first stage, and a source coupled to the output of the second stage. The second transistor includes a drain coupled to the second output of the first stage, and a gate coupled to the output of the second stage.

In another example, an amplifier includes a first stage and a second stage. The first stage includes differential inputs and differential outputs. The second stage includes a single-ended output, a first output transistor, a second output transistor, a third transistor, a fourth transistor, and a compensation network. The single-ended output is coupled to one of the differential inputs. The first output transistor is configured to source current to the single-ended output. The second output transistor is configured to sink current from the single-ended output. The third transistor is coupled to a first of the differential outputs, and is configured to drive the first output transistor. The fourth transistor is coupled to a second of the differential outputs, and is configured to drive the second output transistor. The compensation network is coupled to the single-ended output, the third transistor, and the fourth transistor, and is configured to compensate the third transistor and the fourth transistor based on a signal at the single-ended output.

In a further example, an analog-to-digital conversion circuit includes an analog-to-digital converter and a voltage reference. The voltage reference is coupled to the analog-to-digital converter. The voltage reference includes a reference voltage circuit and an amplifier. The amplifier is coupled between the reference voltage circuit and the analog-to-digital converter, the amplifier includes a first stage and a second stage. The first stage includes differential outputs and differential inputs. A first of the differential inputs is coupled to the reference voltage circuit. The second stage includes a single-ended output, a first output transistor, a second output transistor, a third transistor, a fourth transistor, and a compensation network. The single-ended output is coupled to a second of the differential inputs. The first output transistor is configured to source current to the single-ended output. The second output transistor is configured to sink current from the single-ended output. The third transistor is coupled to a first of the differential outputs, and is configured to drive the first output transistor. The fourth transistor is coupled to a second of the differential outputs, and is configured to drive the second output transistor. The compensation network is coupled to the single-ended output, the third transistor, and the fourth transistor, and is configured to compensate the third transistor and the fourth transistor based on a signal at the single-ended output.

BRIEF DESCRIPTION OF THE DRAWINGS

For a detailed description of various examples, reference will now be made to the accompanying drawings in which.

The same reference number is used in the drawings for the same or similar (either by function and/or structure) features.

DETAILED DESCRIPTION

Analog-to-digital converters (ADCs) are used in a wide variety of applications (e.g., medical devices, flow and temperature metering devices, wireless sensors, etc.). ADC circuitry may include a voltage reference circuitry that generates a reference voltage for use by the ADC. In many applications, circuitry, including the ADC and related circuitry is battery powered. It is desirable to reduce the power used by ADC circuitry to increase battery life. For example, an ADC may be duty cycled to reduce power use. In such systems, the voltage reference circuitry may be always-on to enable faster start-up. Therefore, low quiescent current, low-noise voltage reference circuitry is desirable.

Figure 1:
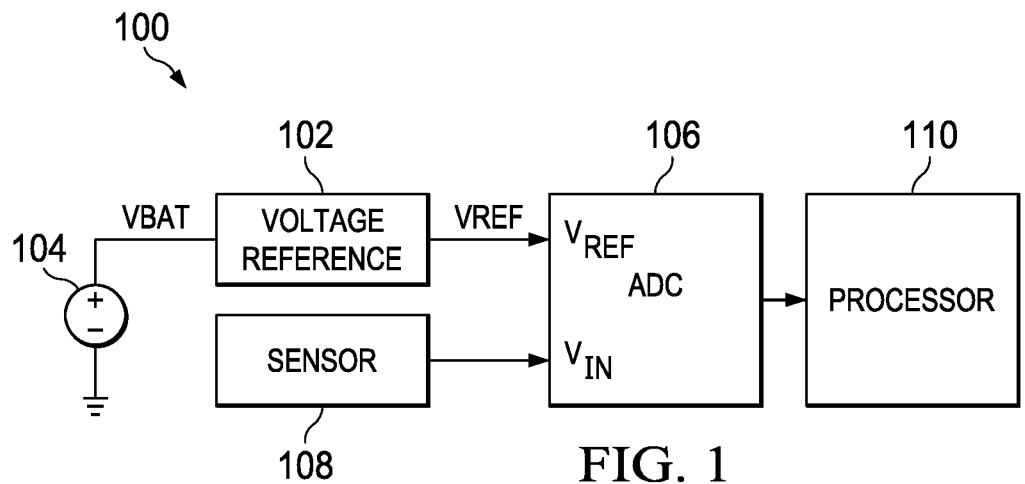
FIG. 1 is a block diagram of an example analog-to-digital conversion circuit.

FIG. 1 is a block diagram of an example analog-to-digital conversion circuit 100. The analog-to-digital conversion circuit 100 includes a voltage reference circuit 102, a voltage source 104, an ADC 106, a sensor 108, and a processor 110. The voltage reference circuit 102 is coupled to the voltage source 104, and outputs a regulated reference voltage for use by the ADC 106. The voltage source 104 may be a battery or other power supply that provides a voltage (VBAT) for powering the voltage reference circuit 102 and other circuitry of the analog-to-digital conversion circuit 100.

The ADC 106 is coupled to the voltage reference circuit 102 for receipt of the reference voltage generated by the voltage reference circuit 102. The ADC 106 applies the reference voltage to digitize a measurement signal received from the sensor 108. The sensor 108 is coupled to the ADC 106, and provides a measurement signal to the ADC 106. The sensor 108 may be, for example, a temperature sensor, a humidity sensor, a voltage sensor, a current sensor, a flow sensor, or any other sensor that produces a measurement signal. The ADC 106 may be configured to implement any of a variety of digitization techniques to convert the measurement signal to a digital value. For example, the ADC 106 may be a successive approximation register ADC, a delta-sigma ADC, a dual slope, ADC, a pipelined ADC, a FLASH ADC, or other type of ADC.

The ADC 106 is coupled to the processor 110. The ADC 106 provides digitized values of the measurement signal to the processor 110 for processing. The processor 110 may be a microcontroller, a general-purpose microprocessor, a digital signal processor, or other digital circuit configured to process digital measurement values generated by the ADC 106.

Figure 2:
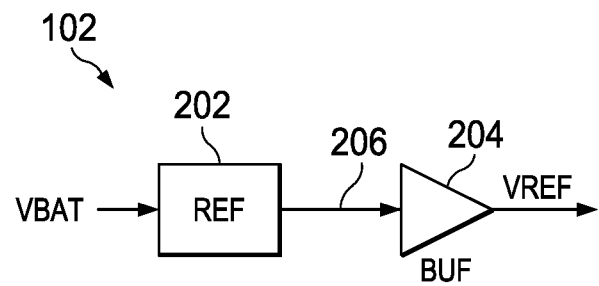
FIG. 2 is block diagram of an example voltage reference circuit suitable for use in the analog-to-digital conversion circuit of FIG. 1.

FIG. 2 is block diagram of an example voltage reference circuit 102 suitable for use in the analog-to-digital conversion circuit 100. The voltage reference circuit 102 includes a reference voltage circuit 202 and an amplifier 204 (a buffer amplifier). The reference voltage circuit 202 is coupled to the voltage source 104 for reception of VBAT. The reference voltage circuit 202 may include a bandgap circuit or other voltage regulation circuit to generate an unbuffered reference voltage 206. The amplifier 204 is coupled to the reference voltage circuit 202. The amplifier 204 receives the unbuffered reference voltage 206 generated by the reference voltage circuit 202, and buffers the unbuffered reference voltage 206 for use by the ADC 106. The amplifier 204 may include a class AB output stage.

In the voltage reference circuit 102, a large portion of the quiescent current (e.g., as much as possible) may be allocated to the reference voltage circuit 202 to reduce thermal noise. Consequently, the quiescent current available to the amplifier 204 is reduced. Because there is insufficient quiescent current in the amplifier 204 to push away parasitic poles, compensation of the amplifier 204 is challenging.

If the output stage of the amplifier 204 is class AB, the circuitry may be more complex than that of a standard low drop out class A output stage. For example, a differential folded cascode topology may be used to meet low input voltage (e.g., 1.7 volts) specifications, and maintain operation at high (e.g., 125 degrees Celsius) temperatures. In the differential folded cascode topology, one side of the folded cascode drives a sourcing output transistor, and the other side drives a sinking output transistor. Ahuja compensation is implemented to compensate the frequency response of some amplifiers using a differential folded cascode topology. However, Ahuja compensation generally applies to single-ended outputs, not to differential outputs. Thus, in some implementations, Ahuja compensation is applied to only one side of the folded cascode (the side controlling sourcing of current to the output). With no compensation provided to the negative (the current sink control) side, the amplifier may be unstable for negative load currents.

The amplifier 204 includes differential Ahuja compensation that provides feedback from the amplifier's single-ended output to both sides of the folded cascode to stabilize the amplifier for both positive and negative loads.

Figure 3:
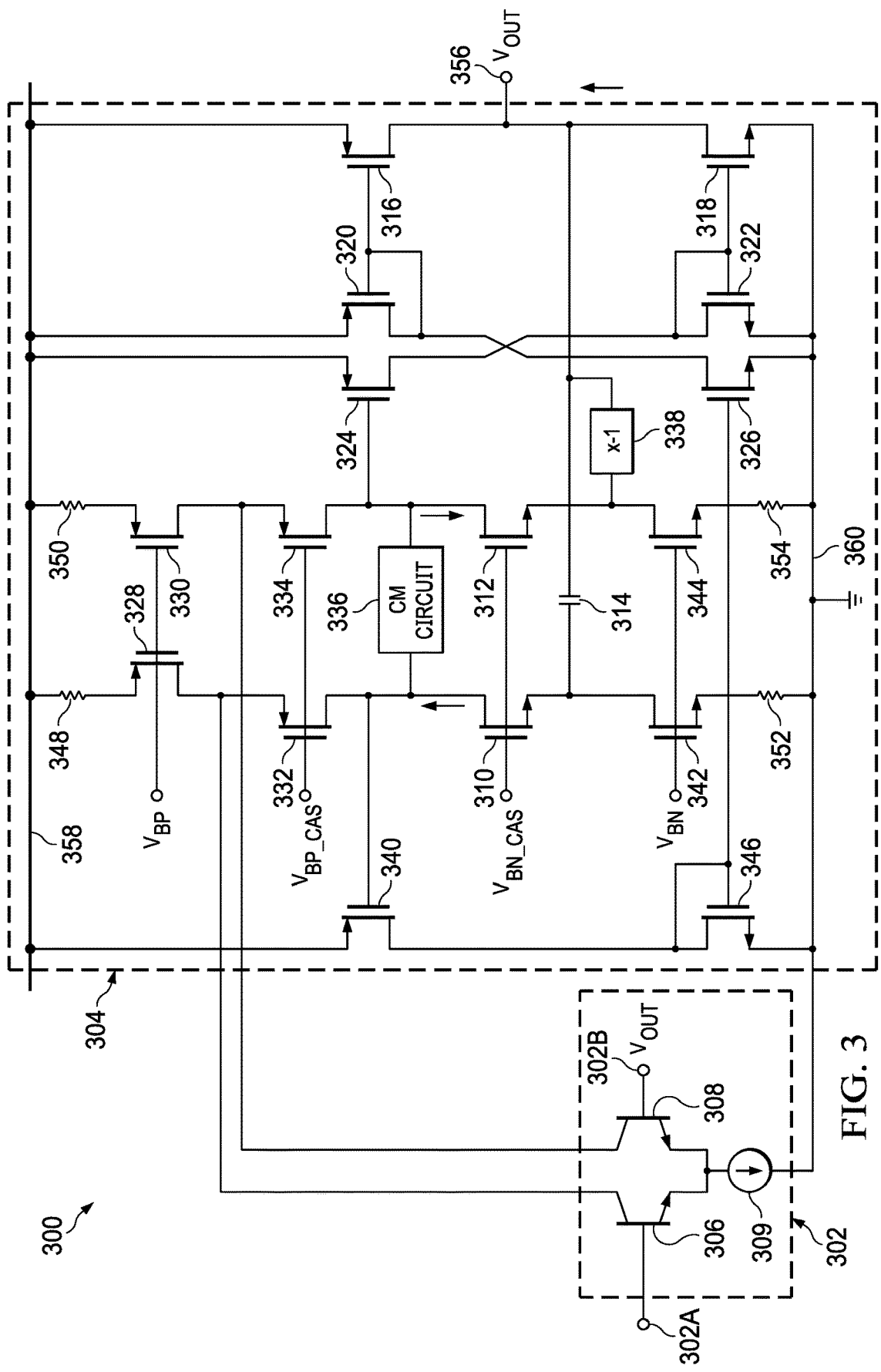
FIG. 3 is a schematic diagram of an example amplifier circuit, that includes differential Ahuja compensation, and is suitable for use in the voltage reference circuit of FIG. 2.

FIG. 3 is a schematic diagram of an example amplifier 300, that includes differential Ahuja compensation. The amplifier 300 is an implementation of the amplifier 204. The amplifier 300 includes an input stage 302 and an output stage 304. The output stage 304 is coupled to the input stage 302. The input stage 302 includes differential inputs (input 302A and input 302B) and differential outputs. The input transistor 306 and the input transistor 308 are connected as a differential pair. The input transistor 306 and the input transistor 308 may be NPN bipolar junction transistors. The base of the input transistor 306 is coupled to the input 302A, and the base of the input transistor 308 is coupled to the input 302B. The emitter of the input transistor 306 is coupled to the emitter of the input transistor 308 and to a tail current source 309. A first output of the input stage 302 is provided at the collector of the input transistor 306, and a second output of the input stage 302 is provided at the collector of the input transistor 308.

The output stage 304 is a differential cascode circuit, and includes high-side circuitry and low-side circuitry. The high-side circuitry includes transistor 316, transistor 320, transistor 326, transistor 346, transistor 328, cascode transistor 332, transistor 340, transistor 342, cascode transistor 310, resistor 348, and resistor 352. The transistor 316, the transistor 320, the cascode transistor 332, the transistor 340, and the transistor 328 may be P-type field effect transistors (PFETs). The transistor 326, the transistor 346, the transistor 342, and the cascode transistor 310 may be N-type FETs (NFETs). The transistor 316 sources current to the output terminal 356 based on a control signal provided at the drain of the cascode transistor 310, through the transistor 340, the transistor 346, the transistor 326, and the transistor 320. The source of the transistor 328 is coupled to a power supply terminal 358 via the resistor 348. A drain of the transistor 328 is coupled to a source of the cascode transistor 332 and the collector of the input transistor 306. A gate of the transistor 328 is coupled to a PFET bias voltage source (not shown). A gate of the cascode transistor 332 is coupled to a PFET cascode bias voltage source (not shown). A drain of the cascode transistor 332 is coupled to a drain of the cascode transistor 310 and a gate of the transistor 340. A source of the cascode transistor 310 is coupled to a drain of the transistor 342. A gate of the cascode transistor 310 is coupled to a cascode bias voltage source (not shown). A source of the transistor 342 is coupled to a ground terminal 360 via the resistor 352. A gate of the transistor 342 is coupled to an NFET bias voltage source (not shown).

A source of the transistor 340 is coupled to the power supply terminal 358, and a drain of the transistor 340 is coupled to a drain and gate of the transistor 346. A source of the transistor 346 is coupled the ground terminal 360. The gate of the transistor 346 is coupled to a gate of the transistor 326 to form a current mirror. A source of the transistor 326 is coupled to the ground terminal 360. A drain of the transistor 326 is coupled to a drain and gate of the transistor 320. A source of the transistor 320 is coupled to the power supply terminal 358. A gate of the transistor 320 is coupled to a gate of the transistor 316 to form a current mirror. A source of the transistor 316 is coupled to the power supply terminal 358, and a drain of the transistor 316 is coupled to the output terminal 356.

A compensation capacitor 314 is coupled between the output terminal 356 and the source of the cascode transistor 310 to stabilize the amplifier 300. The compensation capacitor 314 couples signal from the output terminal 356 to the source of the cascode transistor 310 to compensate the positive side of the differential cascode circuit.

The low-side circuitry includes transistor 318, transistor 322, transistor 324, transistor 330, cascode transistor 334, transistor 344, cascode transistor 312, resistor 350, and resistor 354. The transistor 318, the transistor 322, the cascode transistor 312, and the transistor 344 may be NFETs. The transistor 324, the cascode transistor 334, and the transistor 340 may be PFETs. The transistor 318 sinks current from the output terminal 356 based on a control signal provided at the drain of the cascode transistor 312, through the transistor 324 and the transistor 322. The source of the transistor 330 is coupled to the power supply terminal 358 via the resistor 350. A drain of the transistor 330 is coupled to a source of the cascode transistor 334 and the collector of the input transistor 308. A gate of the transistor 330 is coupled to a gate of the transistor 328. A gate of the cascode transistor 334 is coupled to the gate of the cascode transistor 332. A drain of the cascode transistor 334 is coupled to a drain of the cascode transistor 312 and a gate of the transistor 324. A source of the cascode transistor 312 is coupled to a drain of the transistor 344. A gate of the cascode transistor 312 is coupled to the gate of the cascode transistor 310. A source of the transistor 344 is coupled to the ground terminal 360 via the resistor 354. A gate of the transistor 344 is coupled to the gate of the transistor 342.

A source of the transistor 324 is coupled to the power supply terminal 358, and a drain of the transistor 324 is coupled to a drain and gate of the transistor 322. A source of the transistor 322 is coupled to the ground terminal 360. A gate of the transistor 322 is coupled to a gate of the transistor 318 to form a current mirror. A source of the transistor 318 is coupled to the ground terminal 360, and a drain of the transistor 318 is coupled to the output terminal 356.

A compensation circuit 338 is coupled between the output terminal 356 and the source of the cascode transistor 312. The compensation circuit 338 inverts (changes the sign of) the signal at the output terminal 356 and couples the inverted signal onto the source of the cascode transistor 312 to compensate the negative side of the differential cascode circuit.

A common-mode circuit 336 is coupled to the drain of the cascode transistor 310 and the drain of the cascode transistor 312. The common-mode circuit 336 sets the DC voltage at the drain of the cascode transistor 310 and the drain of the cascode transistor 312 to a common predetermined value.

Figure 4:
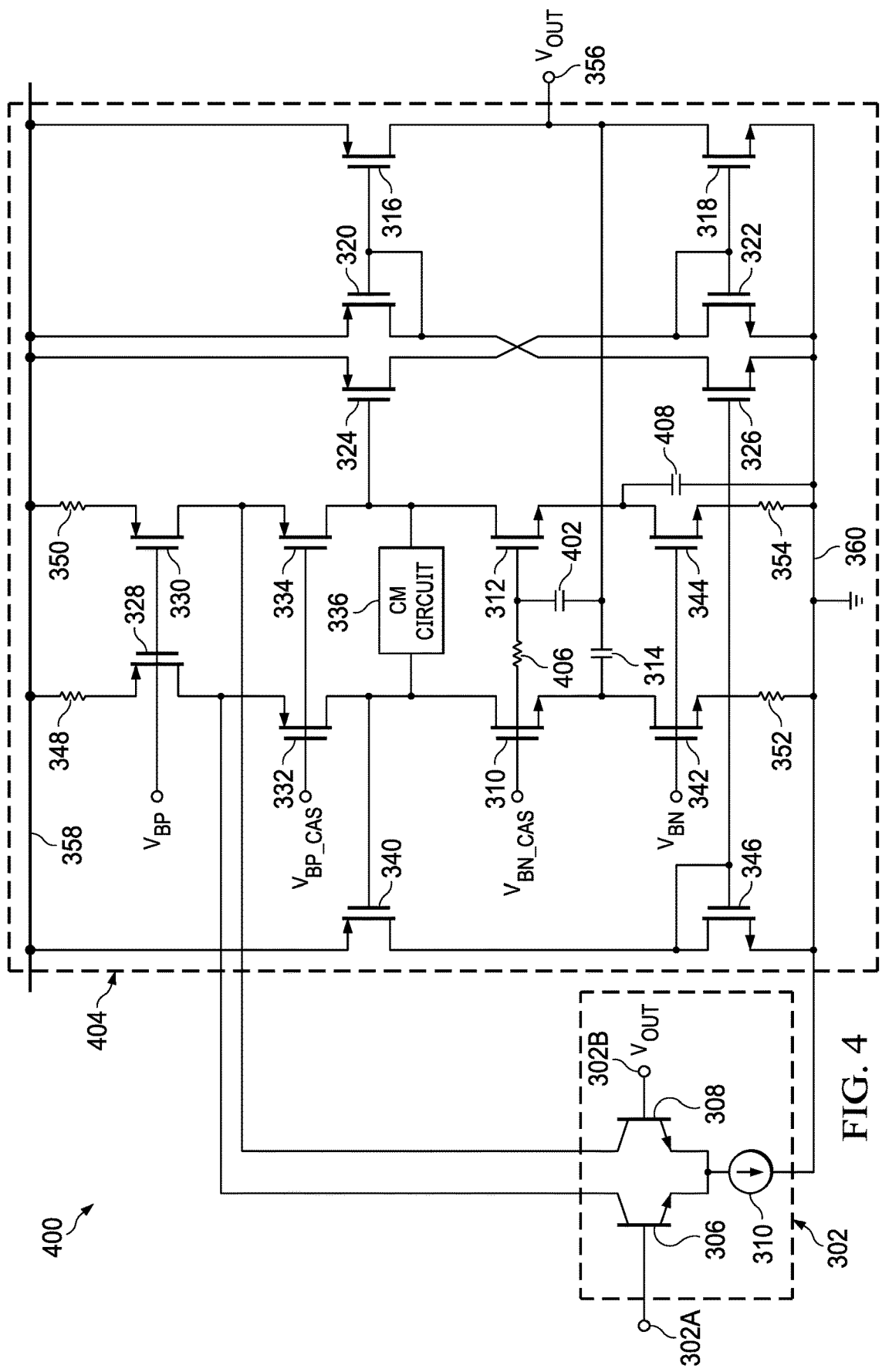
FIG. 4 is a schematic diagram of another example amplifier circuit, that includes differential Ahuja compensation, and is suitable for use in the voltage reference circuit of FIG. 2.

FIG. 4 is a schematic diagram of another example amplifier 400, that includes differential Ahuja compensation. The amplifier 400 is an implementation of the amplifier 204. The amplifier 400 includes the input stage 302 and an output stage 404. The output stage 404 is coupled to the input stage 302. The input stage 302 includes differential inputs (input 302A and input 302B) and differential outputs. The input transistor 306 and the input transistor 308 are connected as a differential pair. The input transistor 306 and the input transistor 308 may be NPN bipolar junction transistors. The base of the input transistor 306 is coupled to the input 302A, and the base of the input transistor 308 is coupled to the input 302B. The emitter of the input transistor 306 is coupled to the emitter of the input transistor 308 and to a tail current source 309. A first output of the input stage 302 is provided at the collector of the input transistor 306, and a second output of the input stage 302 is provided at the collector of the input transistor 308.

The output stage 404 is a differential cascode circuit, and includes high-side circuitry and low-side circuitry. The high-side circuitry includes transistor 316, transistor 320, transistor 326, transistor 346, transistor 328, cascode transistor 332, transistor 340, transistor 342, cascode transistor 310, resistor 348, and resistor 352. The transistor 316, the transistor 320, the cascode transistor 332, the transistor 340, and the transistor 328 may be PFETs. The transistor 326, the transistor 346, the transistor 342, and the cascode transistor 310 may be NFETs. The transistor 316 sources current to the output terminal 356 based on a control signal provided at the drain of the cascode transistor 310, through the transistor 340, the transistor 346, the transistor 326, and the transistor 320. The source of the transistor 328 is coupled to a power supply terminal 358 via the resistor 348. A drain of the transistor 328 is coupled to a source of the cascode transistor 332 and the collector of the input transistor 306. A gate of the transistor 328 is coupled to a PFET bias voltage source (not shown). A gate of the cascode transistor 332 is coupled to a PFET cascode bias voltage source (not shown). A drain of the cascode transistor 332 is coupled to a drain of the cascode transistor 310 and a gate of the transistor 340. A source of the cascode transistor 310 is coupled to a drain of the transistor 342. A gate of the cascode transistor 310 is coupled to a cascode bias voltage source (not shown). A source of the transistor 342 is coupled to a ground terminal 360 via the resistor 352. A gate of the transistor 342 is coupled to an NFET bias voltage source (not shown).

A source of the transistor 340 is coupled to the power supply terminal 358, and a drain of the transistor 340 is coupled to a drain and gate of the transistor 346. A source of the transistor 346 is coupled the ground terminal 360. The gate of the transistor 346 is coupled to a gate of the transistor 326 to form a current mirror. A source of the transistor 326 is coupled to the ground terminal 360. A drain of the transistor 326 is coupled to a drain and gate of the transistor 320. A source of the transistor 320 is coupled to the power supply terminal 358. A gate of the transistor 320 is coupled to a gate of the transistor 316 to form a current mirror. A source of the transistor 316 is coupled to the power supply terminal 358, and a drain of the transistor 316 is coupled to the output terminal 356.

The low-side circuitry includes transistor 318, transistor 322, transistor 324, transistor 330, cascode transistor 334, transistor 344, cascode transistor 312, resistor 350, and resistor 354. The transistor 318, the transistor 322, the cascode transistor 312, and the transistor 344 may be NFETs. The transistor 324, the cascode transistor 334, and the transistor 340 may be PFETs. The transistor 318 sinks current from the output terminal 356 based on a control signal provided at the drain of the cascode transistor 312, through the transistor 324 and the transistor 322. The source of the transistor 330 is coupled to the power supply terminal 358 via the resistor 350. A drain of the transistor 330 is coupled to a source of the cascode transistor 334 and the collector of the input transistor 308. A gate of the transistor 330 is coupled to a gate of the transistor 328. A gate of the cascode transistor 334 is coupled to the gate of the cascode transistor 332. A drain of the cascode transistor 334 is coupled to a drain of the cascode transistor 312 and a gate of the transistor 324. A source of the cascode transistor 312 is coupled to a drain of the transistor 344. A gate of the cascode transistor 312 is coupled to the gate of the cascode transistor 310 via the resistor 406. A source of the transistor 344 is coupled to the ground terminal 360 via the resistor 354. A gate of the transistor 344 is coupled to the gate of the transistor 342.

A source of the transistor 324 is coupled to the power supply terminal 358, and a drain of the transistor 324 is coupled to a drain and gate of the transistor 322. A source of the transistor 322 is coupled to the ground terminal 360. A gate of the transistor 322 is coupled to a gate of the transistor 318 to form a current mirror. A source of the transistor 318 is coupled to the ground terminal 360, and a drain of the transistor 318 is coupled to the output terminal 356.

The amplifier 400 includes a compensation network having a compensation capacitor 314, a compensation capacitor 402, and a compensation capacitor 408. The compensation capacitor 314 is coupled between the output terminal 356 and the source of the cascode transistor 310 to stabilize the amplifier 300. The compensation capacitor 314 couples signal from the output terminal 356 to the source of the cascode transistor 310 to compensate the positive side of the differential cascode circuit. The compensation capacitor 402 is coupled between the output terminal 356 and the gate of the cascode transistor 312. The compensation capacitor 402 AC couples the signal at the output terminal 356 (the output signal of the amplifier 400) to the gate of the cascode transistor 312. Coupling the feedback to the gate of the cascode transistor 312, rather than the source of the cascode transistor 312, effectively inverts (or changes the sign of) the feedback signal. Thus, the feedback provided to the cascode transistor 312 is effectively opposite in sign to that provided to the cascode transistor 310. The compensation capacitor 408 is coupled between the source of the cascode transistor 312 and the ground terminal 360. The compensation capacitor 408 stabilized (holds in place) the voltage at the source of the cascode transistor 312, while the feedback signal received via the compensation capacitor 402 changes the voltage at the gate of the cascode transistor 312. Thus, the compensation capacitor 402 and the compensation capacitor 408 compensate the negative side of the differential cascode circuit. The compensation capacitor 408 places a zero at the same location as the compensation capacitor 314 if the compensation capacitor 408 and the compensation capacitor 314 have approximately the same value of capacitance. The location of the zero is $$\frac{g_{m\_input}}{C_{314}},$$

where $g_{m\_input}$ is the transconductance of the input stage 302, and $C_{314}$ is the capacitance of the compensation capacitor 314.

The common-mode circuit 336 is coupled to the drain of the cascode transistor 310 and the drain of the cascode transistor 312. The common-mode circuit 336 sets the DC voltage at the drain of the cascode transistor 310 and the drain of the cascode transistor 312 to a common predetermined value.

Figure 5:
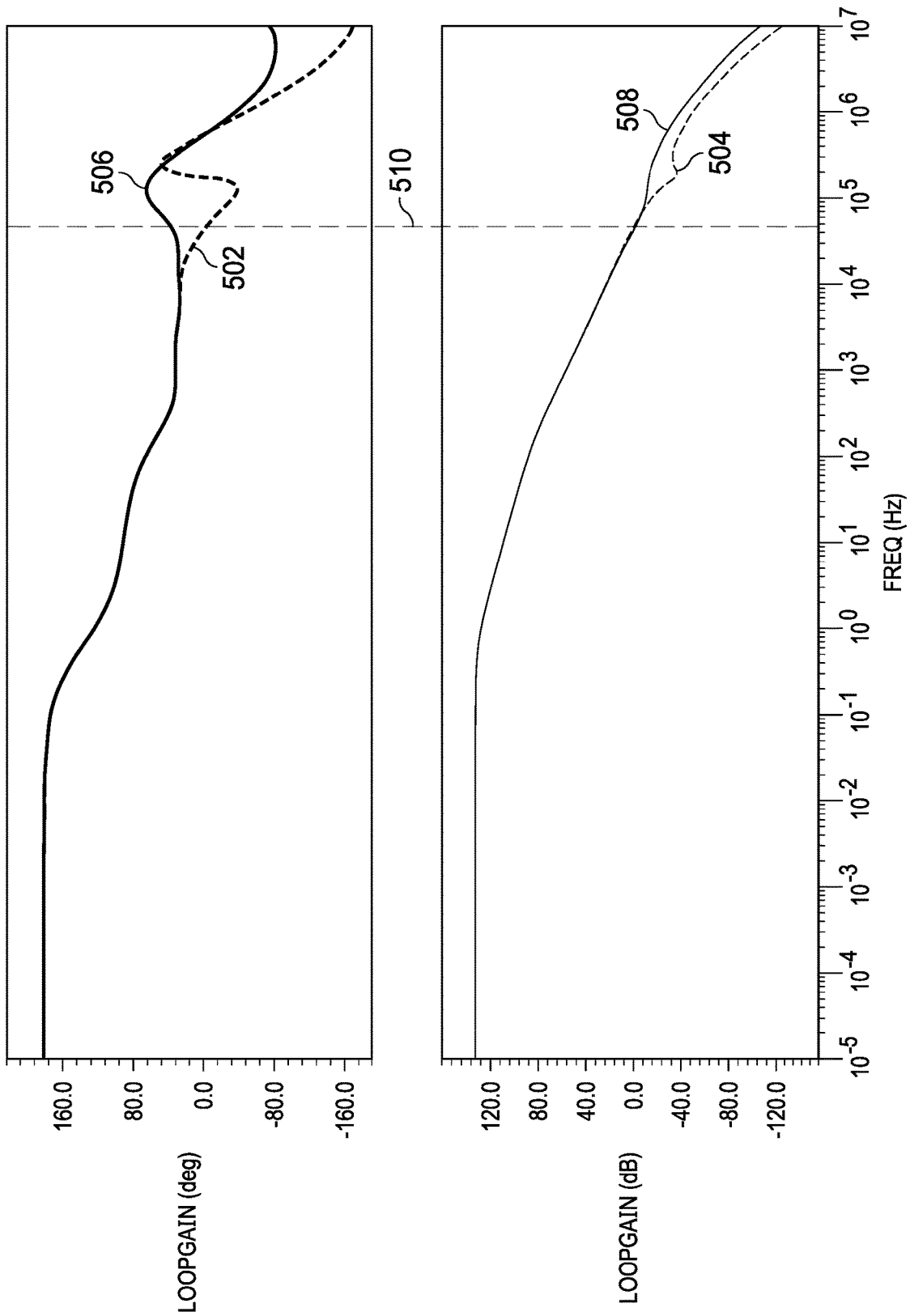
FIG. 5 is an example Bode plot showing amplifier frequency response with and without differential Ahuja compensation.

FIG. 5 is an example Bode plot showing amplifier frequency response with and without differential Ahuja compensation. In FIG. 5, gain plot 508 and phase plot 506 illustrate the response of an example of the amplifier 400. Gain plot 504 and phase plot 502 illustrate the response an amplifier similar to the amplifier 400 that lacks differential Ahuja compensation. The phase plot 506 and the gain plot 508 show that the amplifier 400 provides a phase boost (relative to the phase plot 502 and the gain plot 504) around the unity gain crossover frequency 510, ensuring that the amplifier 400 is stable. The phase plot 506 and the gain plot 508 show that the amplifier without differential Ahuja compensation is unstable for negative loads.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-channel field effect transistor ("PFET") may be used in place of an n-channel field effect transistor ("NFET") with little or no changes to the circuit. Furthermore, other types of transistors may be used (such as bipolar junction transistors (BJTs)).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An amplifier, comprising:
   a first stage including a first output, and a second output;
   a second stage, including:
      an output;
      a first transistor including:
         a drain coupled to the first output of the first stage; and
         a source coupled to the output of the second stage; and
      a second transistor including:
         a drain coupled to the second output of the first stage; and
         a gate coupled to the output of the second stage.

2. The amplifier of claim 1, further comprising a compensation capacitor coupled between the output of the second stage and the source of the first transistor.

3. The amplifier of claim 2, wherein:
   the compensation capacitor is a first compensation capacitor;
   the second transistor includes a source; and
   the amplifier includes a second compensation capacitor coupled between a source of the second transistor and a ground terminal.

4. The amplifier of claim 3, wherein a capacitance of the first compensation capacitor is approximately the same as a capacitance of the second compensation capacitor.

5. The amplifier of claim 1, further comprising a compensation capacitor coupled between the output of the second stage and the gate of the second transistor.

6. The amplifier of claim 1, further comprising a resistor coupled between a gate of the first transistor and the gate of the second transistor.

7. The amplifier of claim 1, further comprising:
   an output transistor including:
      a gate coupled to a drain of the first transistor;
      a drain coupled to the output of the second stage; and
      a source coupled a power supply terminal.

8. The amplifier of claim 1, further comprising:
   an output transistor including:
      a gate coupled to a drain of the second transistor;
      a drain coupled to the output of the second stage; and
      a source coupled to a ground terminal.

9. The amplifier of claim 1, wherein the first stage further comprises:
   a first input transistor including:
      a collector coupled to the drain of the first transistor; and
      an emitter; and
   a second input transistor including:
      a collector coupled to the drain of the second transistor; and
      an emitter coupled to the emitter of the first input transistor.

10. An amplifier, comprising:
    a first stage including differential inputs and differential outputs; and
    a second stage including:
       a single-ended output coupled to one of the differential inputs;
       a first output transistor configured to source current to the single-ended output;
       a second output transistor configured to sink current from the single-ended output;
       a third transistor coupled to a first of the differential outputs, and configured to drive the first output transistor;
       a fourth transistor coupled to a second of the differential outputs, and configured to drive the second output transistor; and
       a compensation network coupled to the single-ended output, the third transistor, and the fourth transistor, and configured to:
          compensate the third transistor and the fourth transistor based on a signal at the single-ended output.

11. The amplifier of claim 10, wherein the compensation network includes a compensation capacitor coupled between the single-ended output and a gate of the fourth transistor.

12. The amplifier of claim 11, wherein:
    the compensation capacitor is a first compensation capacitor; and
    the compensation network includes a second compensation capacitor coupled between a source of the third transistor and a ground terminal.

13. The amplifier of claim 12, wherein the compensation network includes a third compensation capacitor coupled between the single-ended output and a source of the third transistor.

14. The amplifier of claim 13, wherein the first compensation capacitor and the third compensation capacitor have approximately a same capacitance.

15. The amplifier of claim 10, wherein the first stage includes:
    a first input transistor including:
       a collector coupled to a drain of the third transistor; and
       an emitter; and
    a second input transistor including:
       a collector coupled to a drain of the fourth transistor; and
       an emitter coupled to the emitter of the first input transistor.

16. An analog-to-digital conversion circuit, comprising:
    an analog-to-digital converter; and
    a voltage reference coupled to the analog-to-digital converter, the voltage reference including:
       a reference voltage circuit; and
       an amplifier coupled between the reference voltage circuit and the analog-to-digital converter, the amplifier including:
          a first stage including differential outputs and differential inputs, a first of the differential inputs coupled to the reference voltage circuit; and
          a second stage including:
             a single-ended output coupled to a second of the differential inputs;
             a first output transistor configured to source current to the single-ended output;
             a second output transistor configured to sink current from the single-ended output;
             a third transistor coupled to a first of the differential outputs, and configured to drive the first output transistor;
             a fourth transistor coupled to a second of the differential outputs, and configured to drive the second output transistor; and
             a compensation network coupled to the single-ended output, the third transistor, and the fourth transistor, and configured to:
                compensate the third transistor and the fourth transistor based on a signal at the single-ended output.

17. The analog-to-digital conversion circuit of claim 16, wherein the compensation network includes a compensation capacitor coupled between the single-ended output and a gate of the fourth transistor.

18. The analog-to-digital conversion circuit of claim 17, wherein:
- the compensation capacitor is a first compensation capacitor; and
- the compensation network includes a second compensation capacitor coupled between a source of the fourth transistor and a ground terminal.

19. The analog-to-digital conversion circuit of claim 18, wherein:
- the compensation network includes a third compensation capacitor coupled between the single-ended output and a source of the third transistor.

20. The analog-to-digital conversion circuit of claim 19, wherein the first compensation capacitor and the third compensation capacitor have approximately a same value of capacitance.

* * * * *